(12) United States Patent
Honda et al.

(10) Patent No.: US 7,943,905 B2
(45) Date of Patent: May 17, 2011

(54) INFRARED SOLID-STATE IMAGE SENSOR

(75) Inventors: Hiroto Honda, Yokohama (JP);
Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/709,759

(22) Filed: Feb. 22, 2010

(65) Prior Publication Data
US 2010/0230594 A1   Sep. 16, 2010

(30) Foreign Application Priority Data

Mar. 13, 2009   (JP) ................................ 2009-060843

(51) Int. Cl.
*H01L 25/00* (2006.01)
(52) U.S. Cl. ...................................................... 250/332
(58) Field of Classification Search .................. 250/330, 250/331, 332, 333, 334, 338.1–338.5, 339.01–339.15, 250/341.1–341.8
See application file for complete search history.

(56) References Cited

U.S. PATENT DOCUMENTS

| | | | |
|---|---|---|---|
| 6,573,504 B2 * | 6/2003 | Iida et al. | 250/338.4 |
| 7,087,900 B2 * | 8/2006 | Iida et al. | 250/332 |
| 2002/0195563 A1 * | 12/2002 | Iida et al. | 250/332 |
| 2005/0029454 A1 * | 2/2005 | Iida et al. | 250/332 |

OTHER PUBLICATIONS

C. Rouilleau, et al., "Uncooled amorphous silicon 160×120 IRFPA with 25 μm pixel-pitch for large volume applications", Proc. of SPIE, vol. 6542, (2007), pp. 65421V-1-65421V-7.
Tomohiro Ishikawa, et al., "Low-cost 320×240 uncooled IRFPA using conventional silicon process", Part of the SPIE Conference on Infrared Technology and Applications XXV, SPIE vol. 3698, Apr. 1999, pp. 556-564.

* cited by examiner

*Primary Examiner* — David P Porta
*Assistant Examiner* — Kiho Kim
(74) *Attorney, Agent, or Firm* — Oblon, Spivak, McClelland, Maier & Neustadt, L.L.P.

(57) ABSTRACT

An infrared solid-state image sensor comprises:
a pixel area comprising a sensitive pixel area where infrared detection pixels are arranged in a matrix form to detect incident infrared rays on the semiconductor substrate and a reference pixel area where reference pixels are provided, each of the infrared detection pixels comprising a thermoelectric conversion part, the thermoelectric conversion part comprising an infrared absorption film to absorb the incident infrared rays and convert the incident infrared rays to heat and a first thermoelectric conversion element to convert the heat obtained by the conversion in the infrared absorption film to a electric signal, each of the reference pixels comprising a second thermoelectric conversion element. Each of first ends of the reference pixels are connected to a reference potential line, and a difference between the signal potential read out from a corresponding signal line and a reference potential supplied from the reference potential line is amplified and outputted.

8 Claims, 7 Drawing Sheets

A-A SECTION

B-B SECTION

C-C SECTION

INFRARED SOLID-STATE IMAGE SENSOR

CROSS-REFERENCE TO RELATED APPLICATION

This application is based upon and claims the benefit of priority from prior Japanese Patent Application No. 2009-60843 filed on Mar. 13, 2009 in Japan, the entire contents of which are incorporated herein by reference.

BACKGROUND OF THE INVENTION

1. Field of the Invention

The present invention relates to an infrared solid-state image sensor.

2. Related Art

Infrared rays have a feature that the permeability to smoke and fog is high as compared with visible rays. Therefore, infrared image sensing is possible day and night. Since temperature information of the subject can also be obtained, the infrared image sensing has a wide application range such as the defense field, surveillance camera, and fire detecting camera.

In recent years, development of "uncooled infrared solid-state image sensor" which does not need a cooling mechanism has become vigorous. The uncooled i.e., thermal infrared solid-state image sensor apparatus converts incident infrared rays having a wavelength of approximately 10 μm to heat by using an absorption structure, and converts a temperature change in a heat sensitive part caused by feeble heat to an electric signal by using some thermoelectric conversion element. The uncooled infrared solid-state image sensor apparatus obtains infrared image information by reading out the electric signal.

For example, an infrared sensor (infrared solid-state image sensor) using a silicon pn junction which converts a temperature change to a voltage change by supplying a determinate forward current is known (JP-A 2002-300475 (KOKAI)). This infrared sensor has a feature that mass production using a silicon LSI manufacturing process is made possible by using a SOI (Silicon on Insulator) substrate as a semiconductor substrate. Furthermore, the infrared sensor has a feature that the pixel structure can be formed with extreme simplicity because the row selection function is implemented by utilizing the rectifying characteristics of a silicon pn junction (diode) serving as the thermoelectric conversion element.

One of indexes representing the performance of the infrared sensor is NETD (Noise Equivalent Temperature Difference) which represents the temperature resolution of the infrared sensor. It is important to make the NETD small, i.e., make the detected temperature difference corresponding to the noise. For that purpose, it is necessary to raise the signal sensitivity and reduce the noise.

Threshold voltage clamp processing for reducing the influence of threshold dispersion of an amplifying transistor is described in JP-A 2002-300475 (KOKAI). If a sampling transistor turns on, then in the threshold voltage clamp processing, negative charge is stored in the gate of an amplifying transistor capacitive-coupled to a signal line. At this time, it is preferable to converge the voltage across coupling capacitance between the signal line and the amplifying transistor to (Vdd−Vref)−Vth. Here, Vdd is a bias voltage supplied to a pixel by a row selection circuit, Vref is a voltage supplied from a constant load transistor to the signal line, and Vth is a threshold voltage of the pixel. In the threshold voltage clamp processing, dispersion of the threshold voltage among amplifying transistors in each column can be compensated. In each column, however, the noise component existing on the signal line is held the moment threshold voltage clamp is conducted, and thereafter the information is always referenced at the time of row selection. This results in a problem that longitudinal streak noise appears.

SUMMARY OF THE INVENTION

The present invention has been made in view of these circumstances, and an object thereof is to provide an infrared solid-state image sensor capable of reducing the noise at the time of signal readout as much as possible.

An infrared solid-state image sensor according to an aspect of the present invention includes: a semiconductor substrate; a pixel area comprising a sensitive pixel area where a plurality of infrared detection pixels are arranged in a matrix form to detect incident infrared rays on the semiconductor substrate and a reference pixel area where a plurality of reference pixels are provided, each of the infrared detection pixels comprising a thermoelectric conversion part, the thermoelectric conversion part comprising an infrared absorption film to absorb the incident infrared rays and convert the incident infrared rays to heat and a first thermoelectric conversion element to convert the heat obtained by the conversion in the infrared absorption film to a electric signal, each of the reference pixels comprising a second thermoelectric conversion element; a plurality of row selection lines provided in the pixel area so as to correspond to rows of the infrared detection pixels respectively, each of the row selection lines being connected to first ends of the first thermoelectric conversion elements in the infrared detection elements on a corresponding row; a plurality of signal lines provided in the pixel area so as to correspond to columns of the infrared detection pixels respectively, each of the signal lines being connected to second ends of the first thermoelectric conversion elements in the infrared detection elements on a corresponding column to read out an electric signal from an infrared detection pixel on the corresponding column as a signal potential; a reference potential line to which first ends of the second thermoelectric conversion elements respectively in the plurality of reference pixels are connected; a plurality of first constant current sources provided so as to correspond to columns of infrared detection pixels, each of the first constant current sources being connected to second ends of the first thermoelectric conversion elements in the infrared detection pixels on a corresponding column; a plurality of second constant current sources provided so as to correspond to the plurality of reference pixels, each of the second constant current sources being connected to the reference potential line; and a plurality of amplifiers provided so as to correspond to respective signal lines, each of the amplifiers amplifying a difference between the signal potential read out from a corresponding signal line and a reference potential supplied from the reference potential line.

DETAILED DESCRIPTION OF THE INVENTION

Hereafter, embodiments of an infrared solid-state image sensor according to the present invention will be described with reference to the drawings.

First Embodiment

Figure 1:
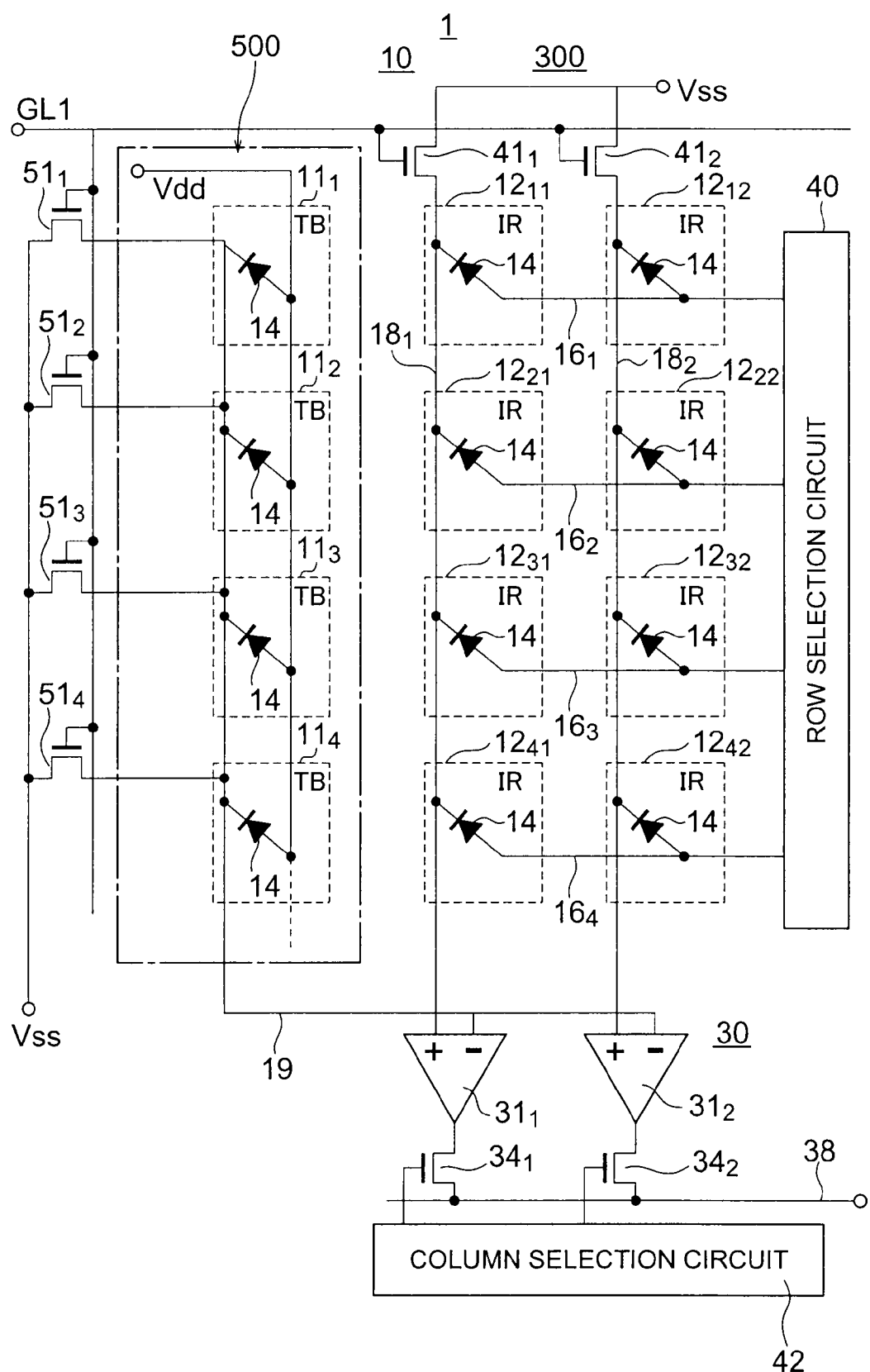
FIG. 1 is a circuit diagram showing a configuration of an infrared solid-state image sensor according to a first embodiment of the present invention.

A configuration of an infrared solid-state image sensor according to a first embodiment of the present invention is shown in FIG. 1. An infrared solid-state image sensor 1 according to the present embodiment is formed on a semiconductor substrate (not illustrated), and includes a pixel area 10 including pixels arranged in a matrix form, a readout circuit 30, a row selection circuit 40, and a column selection circuit 42.

The pixel area 10 includes a sensitive pixel area 300 and an insensitive pixel area (reference pixel area) 500. The sensitive pixel area 300 includes eight pixels $12_{11}$, $12_{12}$, $12_{21}$, $12_{22}$, $12_{31}$, $12_{32}$, $12_{41}$ and $12_{42}$ arranged in four rows and two columns. The insensitive pixel area 500 includes four pixels $11_1$, $11_2$, $11_3$, and $11_4$ arranged in four rows and one column. In general, the pixel area typically includes more pixels. In the present embodiment, however, it is supposed for convenience that the pixel area includes twelve pixels. The pixels $11_1$, $11_2$, $11_3$, and $11_4$ arranged in one column in the insensitive pixel area 500 are insensitive pixels (referred to as reference pixels as well) having no sensitivity to infrared rays and represented as TB (Thermal Black pixel) in FIG. 1. The pixels $12_{11}$, $12_{12}$, $12_{21}$, $12_{22}$, $12_{31}$, $12_{32}$, $12_{41}$ and $12_{42}$ arranged in the first column and the second column in the sensitive pixel area 300 are sensitive pixels (referred to as infrared detection pixels as well) capable of detecting infrared rays, and represented as IR (Infrared Radiation detection pixel) in FIG. 1. The insensitive pixels $11_1$, $11_2$, $11_3$, and $11_4$ may be either of thermal insensitive pixels (TB) and optical insensitive pixels (OB (Optical Black pixel)). Structures of the thermal insensitive pixels (TB) and optical insensitive pixels (OB (Optical Black pixel)) will be described later. Each of the pixels $11_1$, $11_2$, $11_3$, $11_4$, $12_{11}$, $12_{12}$, $12_{21}$, $12_{22}$, $12_{31}$, $12_{32}$, $12_{41}$ and $12_{42}$ includes at least one thermoelectric conversion element, for example, at least one diode 14 formed of a pn junction.

Anodes of diodes 14 in the sensitive pixels $12_{11}$ and $12_{12}$ in the first row are connected to a row selection line $16_1$. Anodes of diodes 14 in the sensitive pixels $12_{21}$ and $12_{22}$ in the second row are connected to a row selection line $16_2$. Anodes of diodes 14 in the sensitive pixels $12_{31}$ and $12_{32}$ in the third row are connected to a row selection line $16_3$. Anodes of diodes 14 in the sensitive pixels $12_{41}$ and $12_{42}$ in the fourth row are connected to a row selection line $16_4$. The row selection lines $16_1$, $16_2$, $16_3$ and $16_4$ are selected one after another by the row selection circuit 40, and a bias voltage Vd is applied to the selected row selection line.

Cathodes of diodes 14 in the sensitive pixels $12_{11}$, $12_{21}$, $12_{31}$ and $12_{41}$ in the first column are connected to a vertical signal line (hereafter also referred to simply as signal line) $18_1$ in the first column. Cathodes of diodes 14 in the sensitive pixels $12_{12}$, $12_{22}$, $12_{32}$ and $12_{42}$ in the second column are connected to a vertical signal line $18_2$ in the second column.

The readout circuit 30 includes differential amplifier circuits $31_1$ and $31_2$ and column selection transistors $34_1$ and $34_2$. An output of the differential amplifier circuit $31_i$ (i=1, 2) is output to a horizontal signal line 38 via the column selection transistor $34_i$. The column selection transistor $34_i$ (i=1, 2) is connected at its gate to the column selection circuit 42 and selected by the column selection circuit 42. Thereby, the selected column selection transistor $34_i$ turns on.

A first end of each vertical signal line $18_i$ (i=1, 2) is connected to a load transistor $41_i$ at its drain. A second end of each vertical signal line $18_i$ (i=1, 2) is connected to a positive side input terminal of the differential amplifier circuit $31_i$. Each load transistor $41_i$ (i=1, 2) operates in a saturation region, and supplies a constant current to a vertical signal line according to a gate voltage applied to its gate. In other words, the load transistor $41_i$ (i=1, 2) functions as a constant current source.

On the other hand, a bias voltage Vd is applied to anodes of diodes 14 in the insensitive pixels $11_i$ (i=1, 2, 3, 4), and cathodes of them are connected to a reference potential line 19. The reference potential line 19 is connected to drains of load transistors $51_1$, $51_2$, $51_3$ and $51_4$, and connected to negative side input terminals of the differential amplifier circuits $31_1$ and $31_2$. Each load transistor $51_i$ (i=1, 2, 3, 4) operates in a saturation region, and supplies a constant current to the reference potential line according to a gate voltage applied to its gate. In other words, the load transistor $51_i$ (i=1, 2, 3, 4) functions as a constant current source.

If the bias voltage Vd is applied to a row selection line selected by the row selection circuit 40, for example, the row selection line $16_1$, then a series voltage Vd-Vd0 is applied to diodes 14 in the sensitive pixels $12_{11}$ and $12_{12}$ connected to the selected row selection line $16_1$. On the other hand, all diodes 14 in the sensitive pixels $12_{21}$, $12_{22}$, $12_{31}$, $12_{32}$, $12_{41}$ and $12_{42}$ connected to unselected row selection lines $16_2$, $16_3$ and $16_4$ are reverse-biased. Therefore, the unselected row selection lines $16_2$, $16_3$ and $16_4$ are separated from the signal lines $18_1$ and $18_2$. In other words, it can be said that the diodes 14 bear the pixel selection function.

A potential on the vertical signal lines $18_1$ and $18_2$ at the time when infrared rays are not received is defined as Vs1. Upon receiving infrared rays, the pixel temperature of the sensitive pixels $12_{ij}$ (i=1, 2, 3, 4, j=1, 2) rises. As a result, the potential Vs1 on the vertical signal lines $18_1$ and $18_2$ becomes high. For example, if the temperature of the subject changes by 1 K (kelvin), then the temperature of the sensitive pixels $12_{ij}$ (i=1, 2, 3, 4, j=1, 2) changes by approximately 5 mK. Supposing that the thermoelectric conversion efficiency is 10 mV/K, the potential on the vertical signal lines $18_1$ and $18_2$ rises by approximately 50 µV. This is very small as compared with the bias voltage Vd.

Characteristics of the sensitive pixels $12_{ij}$ (i=1, 2, 3, 4, j=1, 2) change so as to reflect the temperature of the semiconductor substrate. Therefore, the signal and the substrate temperature cannot be discriminated from each other. In other words, an output change equivalent to approximately 200 times as large as the infrared detection signal even if, for example, the environmental temperature has changed by only 1 K.

The insensitive pixels $11_i$ (i=1, 2, 3, 4) reflect only the temperature information of the semiconductor substrate because they are insensitive to infrared rays. Therefore, if a difference between an output signal of a sensitive pixel and an output signal of an insensitive pixel is obtained, then only infrared information can be detected.

If there is only one insensitive pixel on the semiconductor substrate and its output signal is used as a reference signal, then electric noise generated in the insensitive pixel is also used as the reference signal and consequently a potential functioning as the base fluctuate. When seen as a moving picture, it looks as flicker (fluctuation).

In the present embodiment, the noise component is suppressed by connecting a plurality of (four in FIG. 1) insensitive pixels $11_1$ to $11_4$ in parallel and averaging their outputs. Specifically, the power supply voltage Vdd which becomes a common potential is supplied to anodes of diodes 14 of the insensitive pixels $11_1$ to $11_4$, and their cathodes are connected to the reference potential line 19 having a common output potential. The drains of the load transistors $51_1$ to $51_4$ installed so as to have the same number as that of the insensitive pixels are connected to the reference potential line 19 to cause the constant current to flow. Disposing the four load transistors $51_1$ to $51_4$ is equivalent to disposing one transistor having a gate width which is four times that of the load transistors $51_1$ to $51_4$. In the present embodiment, however, as many load transistors $51_i$ (i=1, 2, 3, 4) as the number of the insensitive pixels are installed, considering that the load transistors $51_i$ (i=1, 2, 3, 4) are equivalent in manufacturing dispersion to the load transistors $41_i$ (i=1, 2) connected to the sensitive pixels. The gate potential of the load transistor $51_i$ (i=1, 2, 3, 4) is set equal to GL1 which is the same potential as the gate potential of the load transistor $41_i$ (i=1, 2) connected to the sensitive pixels to cause an equal current to flow.

If there is no dispersion and temporal variation noise in the insensitive pixels $11_1$ to $11_4$ at this time, then the potential (reference potential) on the reference potential line 19 becomes Vdd-Vref. Here, Vref is a forward voltage of the insensitive pixels $11_1$ to $11_4$. If there is dispersion δVref(i) in the forward voltage of the insensitive pixels $11_i$ (i=1, n), then the potential on the reference potential line 19 is given by Vdd−Vref+ΔVref Here, ΔVref is represented as (δVref(1)²+δVref(2)²+ . . . +δVref(n)²)$^{1/2}$/n Here, n is the total number of the insensitive pixels. For example, it is supposed that the dispersion and temporal variation noise δVref(i) for insensitive pixels is equally 10 μV. If n=1, then it follows that ΔVref=10 μV. If n=100, then it follows that ΔVref=1 μV. The noise voltage decreases in inverse proportion to a square root of n. In other words, as a larger number of insensitive pixels are connected, the signal-to-noise ratio or stability of the reference potential is improved.

The reference potential obtained in this way is input to the negative side input terminals of the differential amplifier circuits $31_1$ and $31_2$, and difference signals between signal potentials appearing on the vertical signal lines $18_1$ and $18_2$ and the reference potential are output from the differential amplifier circuits $31_1$ and $31_2$, respectively. Difference signals on respective columns are coupled to the horizontal signal line 38 via the column selection transistors $34_1$ and $34_2$, respectively. A pulse voltage from the column selection circuit 42 is applied to the gate of the column selection transistor 24 one column after another. In this way, the difference signal of every column is swept out onto the horizontal signal line 38 and output one column after another.

As heretofore described, the row selection circuit 40 selects a row selection line. The temperature change of the subject is taken out as the electric signals by sensitive pixels connected to the selected row selection line. The electric signals are read out as the signal potentials onto the signal lines. The difference signals between the signal potentials and a reference potential is amplified by the differential amplifying circuits. The amplified difference signals are read out onto the horizontal signal line 38 one after another by the column selection transistors $34_1$ and $34_2$.

In the conventional threshold voltage clamp processing as described earlier, the noise component existing on the signal line is held at the moment threshold voltage clamp is conducted, and thereafter the information is always referenced at the time of row line selection. This results in a problem that longitudinal streak noise appears.

On the other hand, in the infrared solid-state image sensor according to the present embodiment, the difference signal between every sensitive pixel and an insensitive pixel is always output. In principle, therefore, noise is not held and the longitudinal streak noise is not generated.

Figure 2:
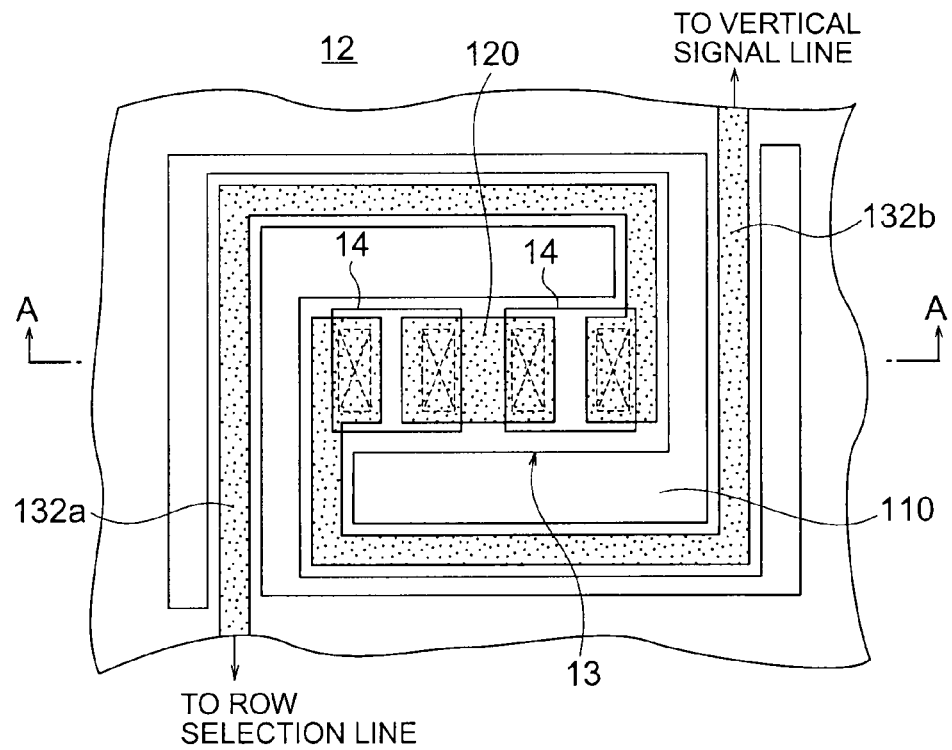
FIG. 2 is a top view of a sensitive pixel used in the first embodiment.
Figure 3:
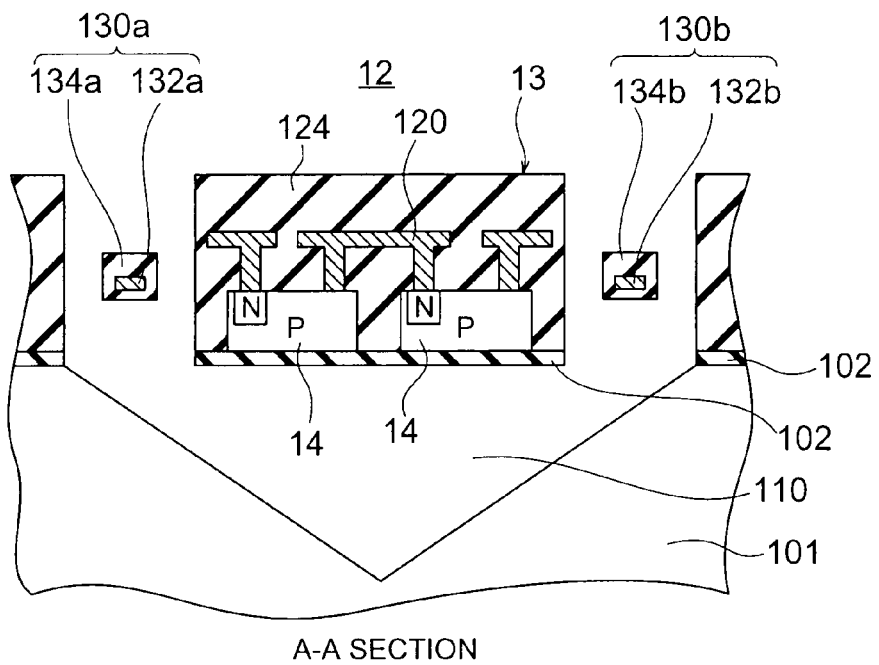
FIG. 3 is a sectional view of a sensitive pixel used in the first embodiment.

A structure of a sensitive pixel in the infrared solid-state image sensor according to the present embodiment will now be described with reference to FIGS. 2 and 3. FIG. 2 is a top view of a sensitive pixel 12 in the infrared solid-state image sensor according to the present embodiment. FIG. 3 is a sectional view obtained when the sensitive pixel 12 is cut along a cutting line A-A shown in FIG. 2. The sensitive pixel 12 is formed on a SOI substrate. This SOI substrate includes a supporting substrate 101, a buried insulation layer (BOX layer) 102, and a SOI (Silicon-On-Insulator) layer formed of silicon single crystal. A concave part 110 is formed on a surface part of the SOI substrate. The sensitive pixel 12 includes a thermoelectric conversion element 13 formed in the SOI layer, and supporting structure parts 130a and 130b which support the thermoelectric conversion element 13 over the concave part 110. The thermoelectric conversion element 13 includes a plurality of (two in FIGS. 2 and 3) diodes 14 connected in series, interconnections 120 for connecting these diodes 14, and an infrared absorption film 124 formed so as to cover the diodes 14 and the interconnections 120. The supporting structure part 130a includes interconnection 132a which is connected at a first end thereof to a corresponding row selection line and connected at a second end thereof to a first end of a serial circuit formed of diodes connected in series, and an insulation film 134a which covers the interconnection 132a. The other supporting structure part 130b includes interconnection 132b which is connected at a first end thereof to a corresponding vertical signal line and connected at a second end thereof to a second end of the serial circuit formed of the diodes connected in series, and an insulation film 134b which covers the interconnection 132b.

The infrared absorption film 124 generates heat in response to incident infrared rays. The diodes 14 convert the heat generated by the infrared absorption film 124 to an electric signal. The supporting structure parts 130a and 130b are formed so as to be long and narrow and surround the periphery of the thermoelectric conversion part 13. As a result, the thermoelectric conversion part 13 is supported over the SOI substrate in a state in which the thermoelectric conversion part 13 is nearly thermally insulated from the SOI substrate.

Owing to such a structure, the sensitive pixel 12 can store the heat generated according to the incident infrared rays and output a voltage based on the heat to the signal line.

The bias voltage Vd from the row selection line is transferred to the diodes 14 via the interconnection 132a. The cathode side voltage of the diodes 14, i.e., the signal voltage is transferred to the vertical signal line via the interconnection 132b.

Figure 4:
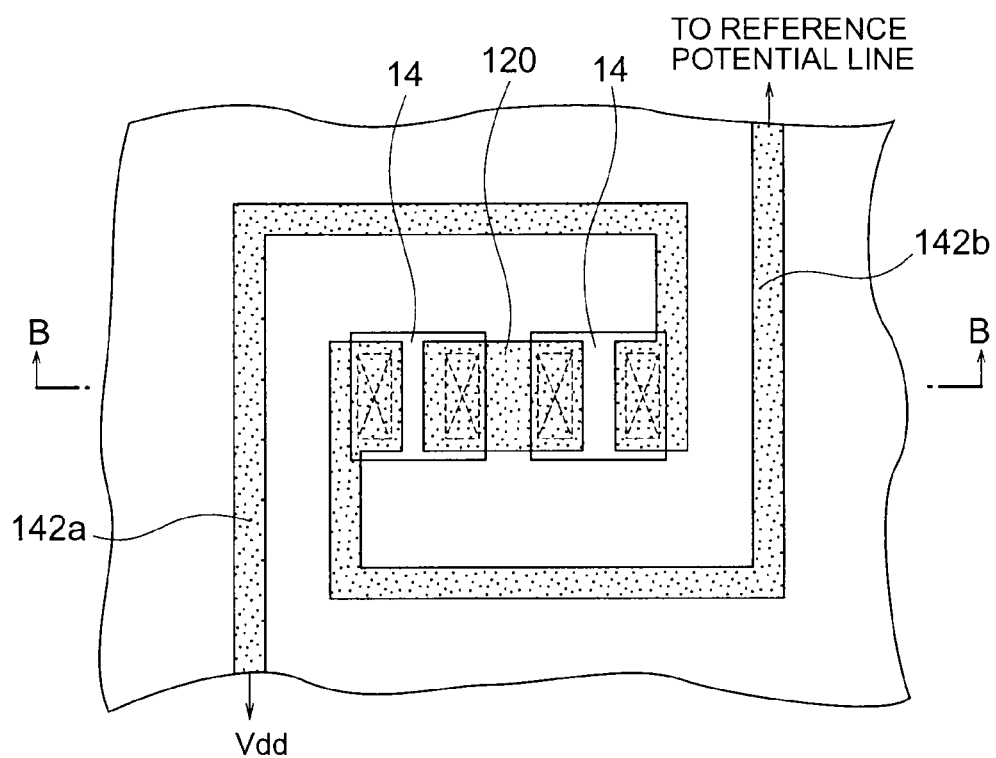
FIG. 4 is a top view of a specific example of an insensitive pixel used in the first embodiment.
Figure 5:
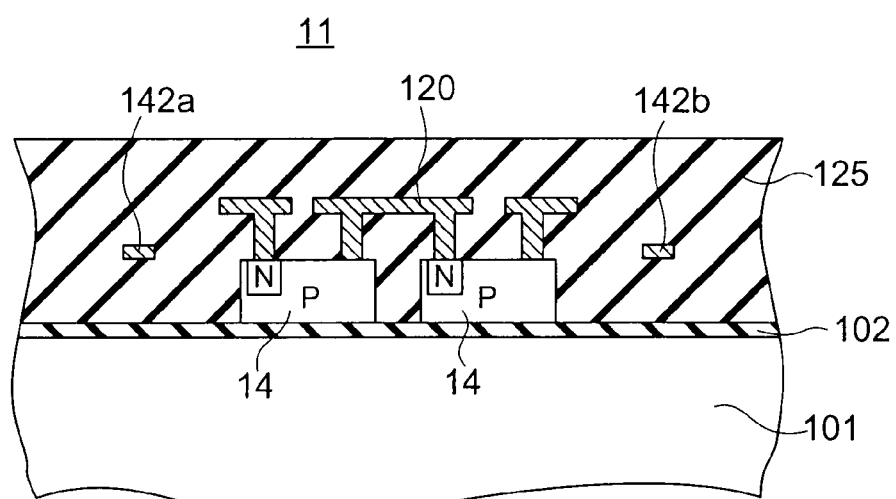
FIG. 5 is a sectional view of a specific example of an insensitive pixel used in the first embodiment.

A configuration of a specific example of an insensitive pixel in the infrared solid-state image sensor according to the present embodiment will now be described with reference to FIGS. 4 and 5. FIG. 4 is a top view of an insensitive pixel 11 in this specific example. FIG. 5 is a sectional view obtained when the insensitive pixel 11 is cut along a cutting line B-B shown in FIG. 4. The insensitive pixel 11 is a thermal insensitive pixel (TB), and is formed on a SOI substrate in the same way as the sensitive pixel 12. Unlike the case of the sensitive pixel 12, however, the concave part 110 is not formed in an area of the SOI substrate in which the insensitive pixel 11 is formed. The insensitive pixel 11 includes a plurality of (two in FIGS. 4 and 5) diodes 14 formed in a SOI layer of the SOI substrate and connected in series, interconnections 120 for connecting these diodes 14, interconnection 142a which is connected at a first end thereof to a power supply line having a determinate potential Vdd and connected at a second end thereof to a first end of a serial circuit formed of diodes connected in series, interconnection 142b which is connected at a first end thereof to a corresponding reference potential line and connected at a second end thereof to a second end of the serial circuit formed of the diodes connected in series, and an insulation film 125 formed so as to cover the diodes 14, the interconnections 120, 142a and 142b.

In the insensitive pixel 11 configured as heretofore described, heat generated by the diodes 14 is diffused to the insulation film 125, the buried insulation layer 102 and a bulk substrate (not illustrated) disposed around them. In other words, thermal conductance between the diodes 14 and their peripheral structure is higher than that of the sensitive pixel 12. The insensitive pixel 11 in this specific example does not have a heat storage function because it does not have the concave part 110. Therefore, the insensitive pixel 11 in this specific example reflects the temperature of the SOI substrate. Such an insensitive pixel is called substrate temperature measuring pixel as well.

Figure 6:
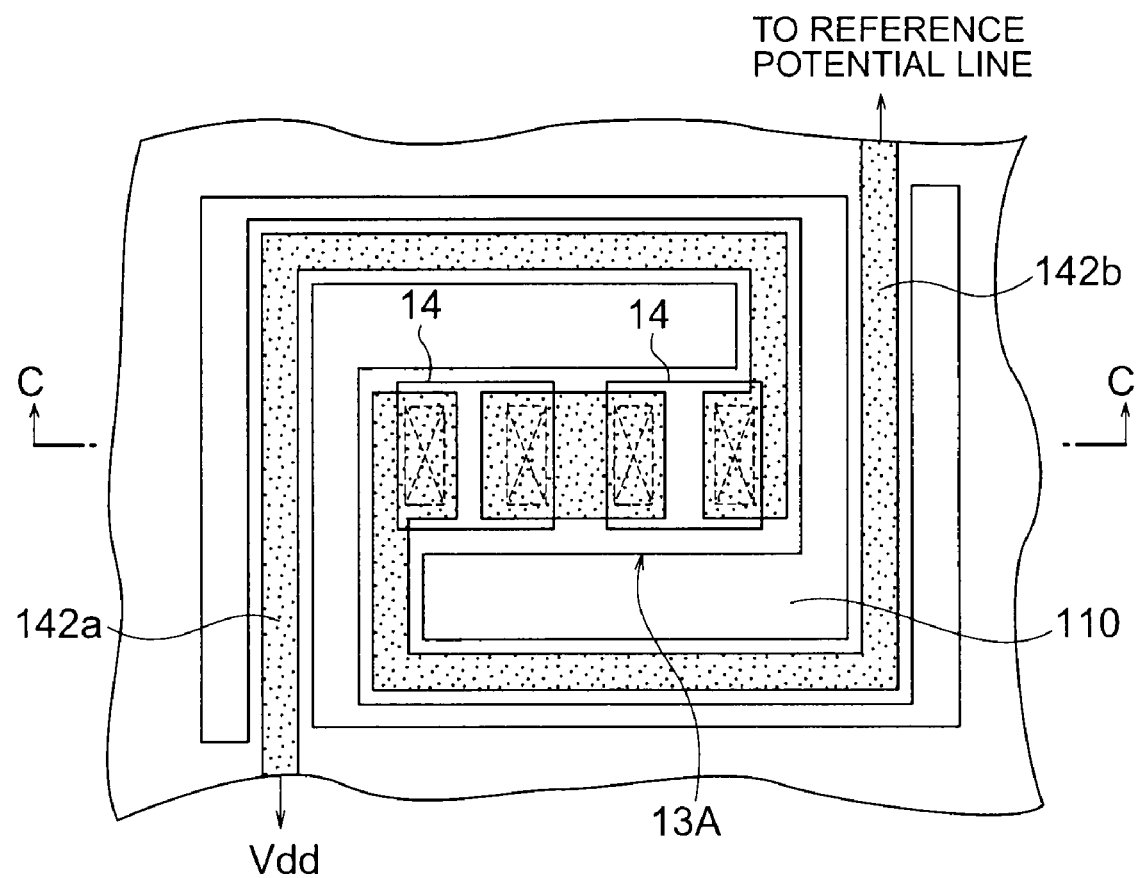
FIG. 6 is a top view of another specific example of an insensitive pixel used in the first embodiment.
Figure 7:
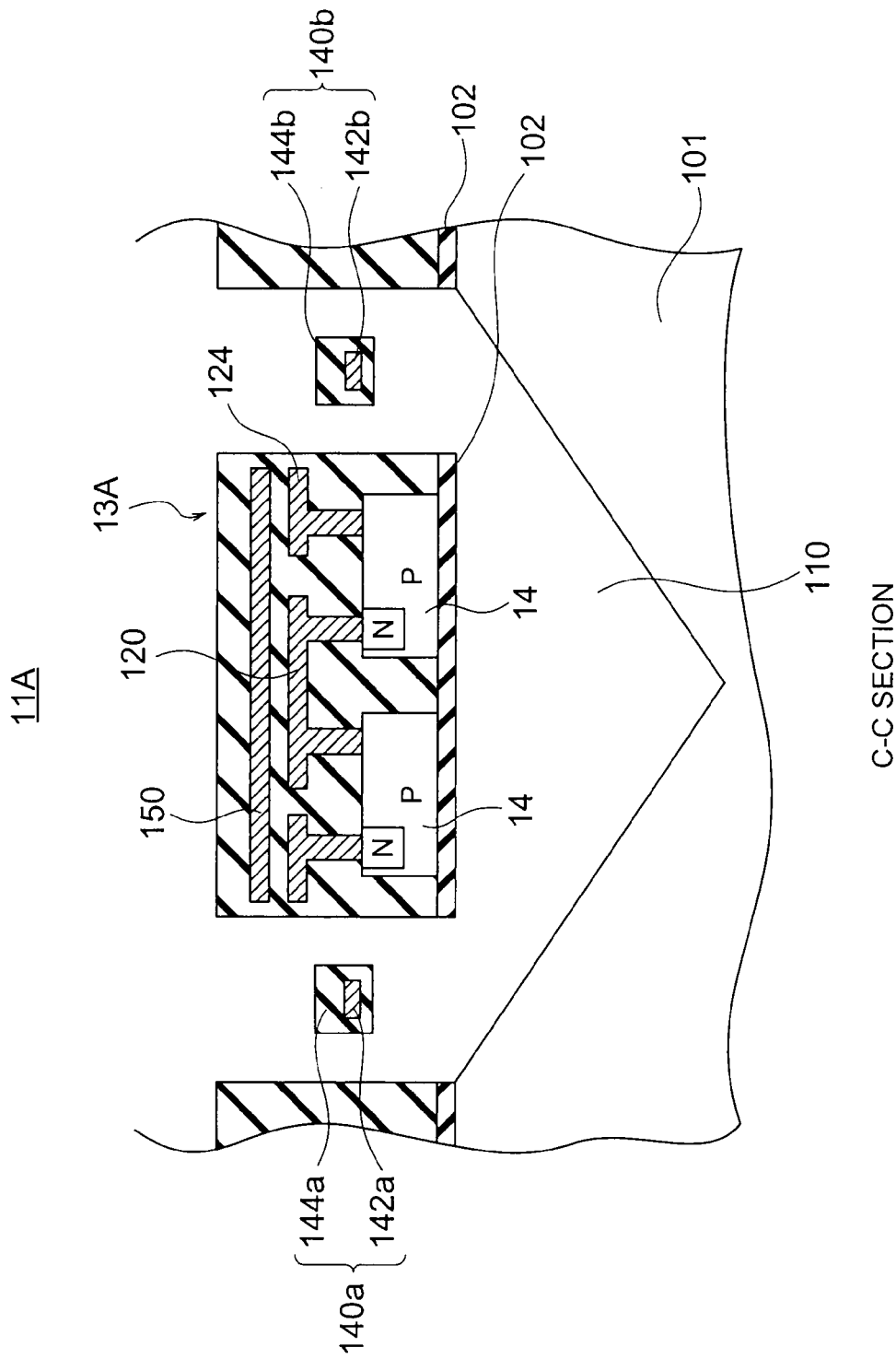
FIG. 7 is a sectional view of another specific example of an insensitive pixel used in the first embodiment.

A configuration of another specific example of an insensitive pixel in the infrared solid-state image sensor according to the present embodiment will now be described with reference to FIGS. 6 and 7. FIG. 6 is a top view of an insensitive pixel 11A in this specific example. FIG. 7 is a sectional view obtained when the insensitive pixel 11A is cut along a cutting line C-C shown in FIG. 6. The insensitive pixel 11A in this specific example is an optical insensitive pixel (OB), and is formed on a SOI substrate having an concave part 110 formed on a surface part in the same way as the sensitive pixel 12. The insensitive pixel 11A includes a reflection part 13A formed in the SOI layer, and supporting structure parts 140a and 140b which support the reflection part 13A over the concave part 110. The reflection part 13A includes a plurality of (two in FIGS. 6 and 7) diodes 14 connected in series, interconnections 120 for connecting these diodes 14, an infrared reflection film 150 formed so as to cover the diodes 14 and the interconnections 120, and an infrared absorption film 124 formed so as to cover the diodes 14, the interconnections 120 and the infrared reflection film 150. The supporting structure part 140a includes interconnection 142a which is connected at a first end thereof to a power supply line having the determinate potential Vdd and connected at a second end thereof to a first end of a serial circuit formed of diodes connected in series, and an insulation film 144a which covers the interconnection 142a. The other supporting structure part 140b includes interconnection 142b which is connected at a first end thereof to a corresponding reference potential line and connected at a second end thereof to a second end of the serial circuit formed of the diodes connected in series, and an insulation film 144b which covers the interconnection 142b. It is desirable to use an aluminum film as the infrared reflection film 150 in order to sufficiently reflect infrared rays.

The insensitive pixel 11A having such a configuration differs from the sensitive pixel 12 in that it has the infrared reflection film 150 in the infrared absorption film 124. The optical insensitive pixel 11A is not sensitive to infrared rays because it reflects infrared rays. In other points, the optical insensitive pixel 11A has the same structure as that of the sensitive pixel 12. Therefore, the optical insensitive pixel 11A is more suitable than the substrate temperature measuring pixel (thermal insensitive pixel) 11 as the reference pixel. For example, as for the temperature of the sensitive pixel (infrared detection pixel) 12, Joule heat generated when a thermoelectric conversion part 12 is selected is added to the temperature of the semiconductor substrate 101, and in addition a temperature component corresponding to an infrared signal is added. Supposing that the temperature of the semiconductor substrate 101 is 25° C., the Joule heat corresponds to approximately 0.1° C., and the temperature component corresponding to the infrared signal becomes the order of approximately 0.01° C. when the temperature of the subject has changed by 1° C. The optical insensitive pixel (OB) 11A has the temperature of the semiconductor substrate 101 and the temperature component due to Joule heat in the same way as the infrared detection pixel. It can be said that the optical insensitive pixel (OB) 11A is a faithful insensitive pixel in that it reproduces the temperature component.

The thermal insensitive pixel (TB) 11 does not have a temperature component due to Joule heat. Since the thermal insensitive pixel (TB) 11 does not have a concave part 110, however, dispersion of I-V characteristics among pixels generated by formation of the concave part 110 is little. Therefore, there is an advantage that dispersion of the reference voltage value among elements is suppressed by using the thermal insensitive pixels (TBs).

The Joule heat component generated when a current is caused to flow through the diodes 14 does not exist in the thermal insensitive pixel 11. In this respect, the thermal insensitive pixel 11 differs from the sensitive pixel 12. However, the optical insensitive pixel 11A has the same temperature components except the temperature change due to infrared rays. The infrared reflection film 124 may be formed in the same layer as an interconnection layer which forms the differential amplifying circuits $31_1$ and $31_2$. In this case, the manufacturing process can be shortened and the cost reduction is possible.

According to the present embodiment, it becomes possible to reduce noise generated in principle when outputting the difference between an insensitive pixel and a sensitive pixel and achieve a high signal-to-noise ratio as heretofore described.

In the present embodiment, a thermoelectric conversion element which converts heat to an electric signal is used for each pixel and diodes are used as the thermoelectric conversion element. However, resistors may be used instead of the diodes.

Figure 8:
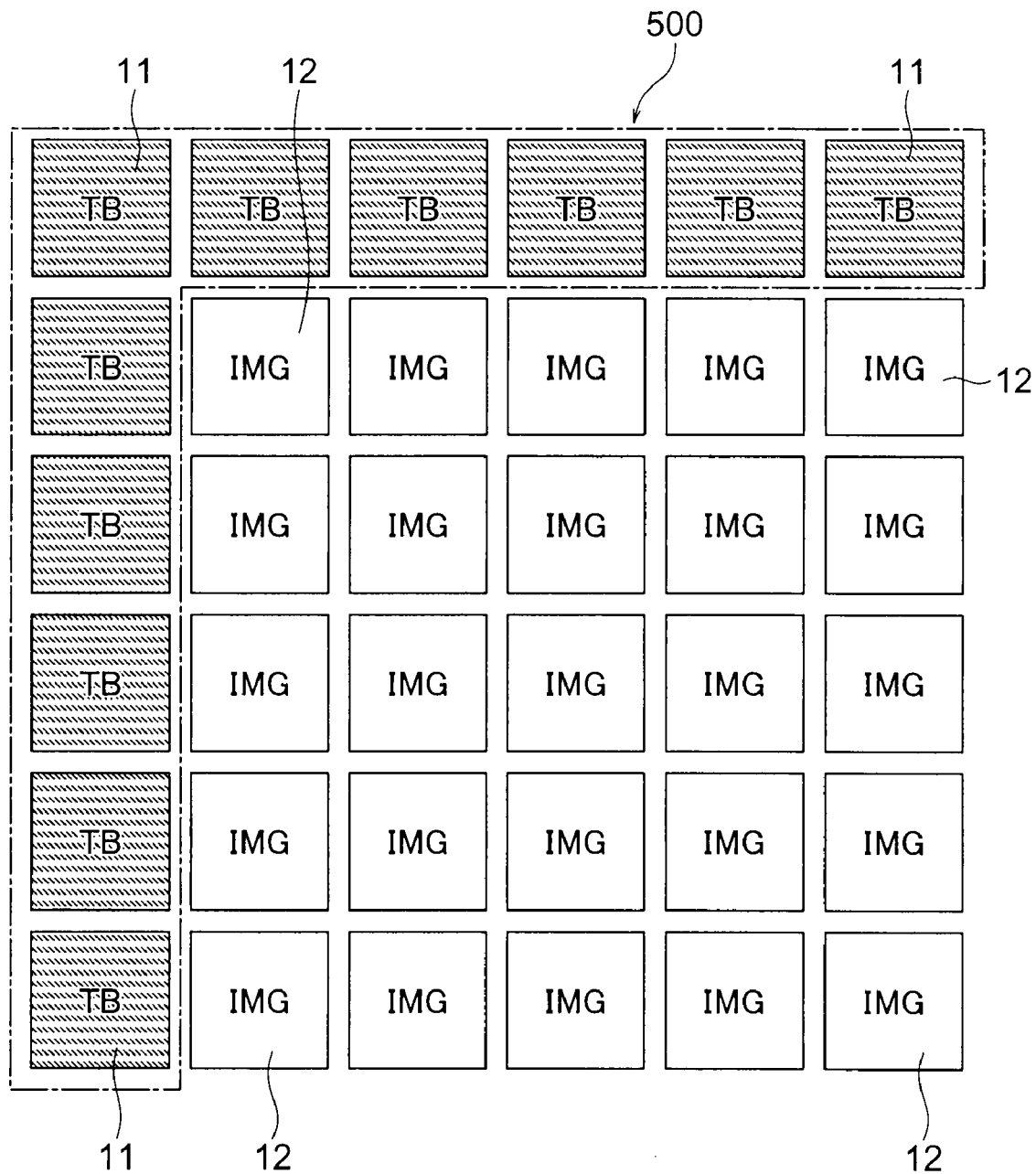
FIG. 8 is a diagram showing an arrangement of insensitive pixels in an infrared solid-state image sensor according to the first embodiment.

The insensitive pixel area 500 described in the present embodiment can be disposed in an arbitrary position. In the present embodiment, however, for example, the insensitive pixels 11 are arranged so as to be adjacent to the up side and the left side of a sensitive pixel array having sensitive pixels (infrared detection pixels (IMG)) 12 arranged in a matrix form as shown in FIG. 8. In FIG. 8, the infrared detection pixels 12 are arranged in a matrix form of five rows by five columns. In this case, the number of insensitive pixels 11 becomes eleven. As a matter of fact, the insensitive pixels 12 are typically arranged in 120 rows by 160 columns, 240 rows by 320 columns, or 480 rows by 640 columns. In those cases, the total number of the insensitive pixels 110 becomes 281, 561 and 1121, respectively. In those cases, the signal-to-noise ratio of the reference voltage can be improved to 16.8 times, 23.7 times and 33.7 times as compared with the case where there is one insensitive pixel, respectively.

By arranging the insensitive pixels so as to be adjacent to the up side and the left side of the sensitive pixel array in this way, the number of the insensitive pixels 11 can be increased while effectively using the area and the temperature distribution in the area including the insensitive pixels 11 and the infrared detection pixels 12 can be monitored more accurately.

The arrangement positions of the insensitive pixels 11 are not restricted to the up side and the left side of the sensitive pixel array, but the insensitive pixels 11 may be arranged so as to be adjacent to the up side and the right side, or may be arranged so as to be adjacent to the down side and the left side. Alternatively, the insensitive pixels 11 may be arranged so as to surround the four sides of the sensitive pixel array. Furthermore, the insensitive pixels 11 may be arranged in at least two columns or at least two rows for each of the sides of the sensitive pixel array.

Second Embodiment

An infrared solid-state image sensor according to a second embodiment of the present invention will now be described with reference to FIG. 9. The infrared solid-state image sensor according to the present embodiment is different from the infrared solid-state image sensor according to the first embodiment only in arrangement of insensitive pixels.

Figure 9:
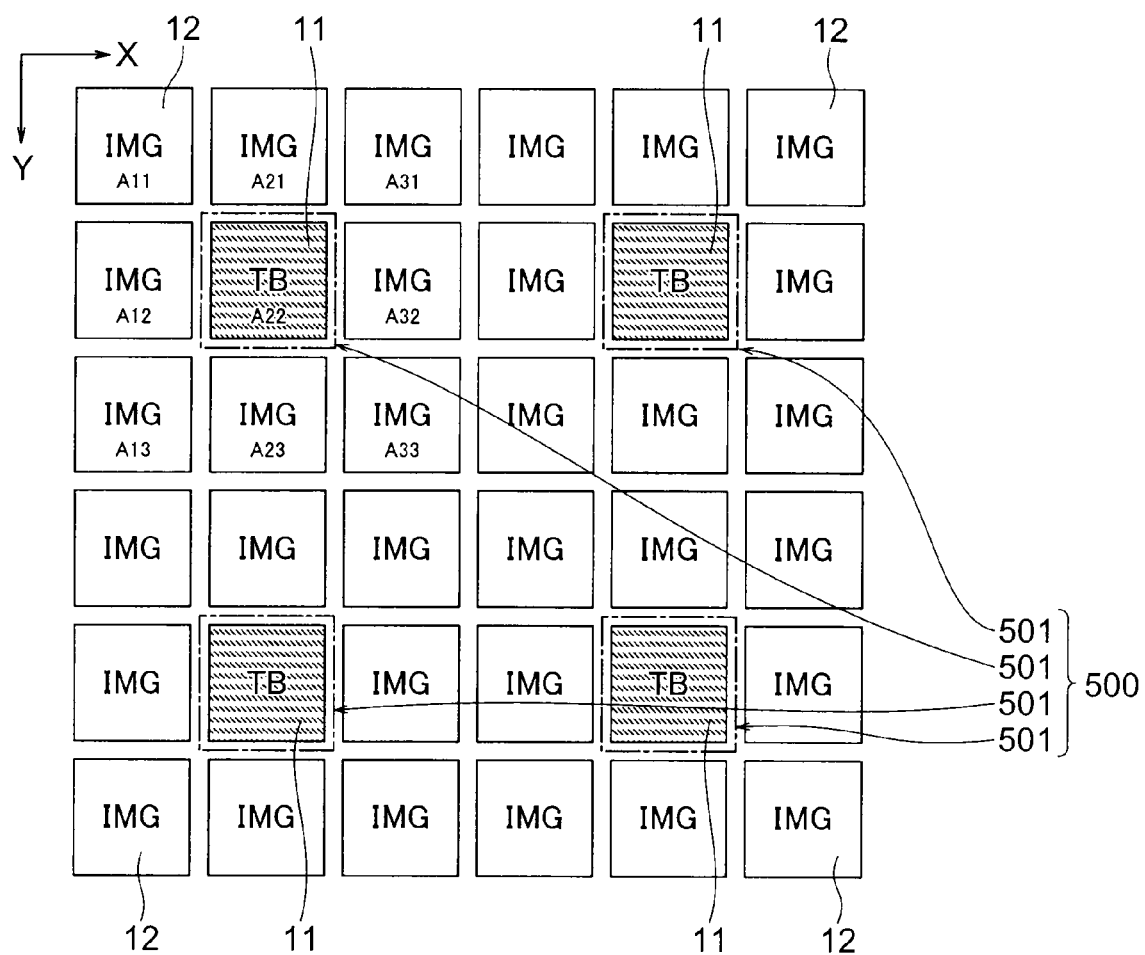
FIG. 9 is a diagram showing an arrangement of insensitive pixels in an infrared solid-state image sensor according to a second embodiment.

In the present embodiment, the insensitive pixel area 500 includes sub-areas 501 each provided every insensitive pixel, and the insensitive pixels 11 in the sub-areas 501 are arranged within a sensitive pixel array formed of sensitive pixels (infrared detection pixels) 12 as shown in FIG. 9. In this case as well, respective insensitive pixels 11 are interconnected and coupled so as to correspond to the insensitive pixel area 500 shown in FIG. 1. The interconnections are arranged in gaps between pixels.

In the present embodiment, the image of the subject cannot be picked up in the insensitive pixel 11, for example, in an insensitive pixel 11 disposed in the second row and the second column (X coordinate=2 and Y coordinate=2) shown in FIG. 9. Therefore, processing for interpolating the subject signal is conducted by using eight infrared detection pixels 12 surrounding the pixel. The interpolation processing can be conducted on the signal output from the semiconductor substrate, in a camera circuit. When the subject signal is interpolated at the insensitive pixel 11 located in the second row and the second column (X coordinate=2 and Y coordinate=2) shown in FIG. 9, if the signal value is represented as $A_{XY}$ (where X and Y represent the X coordinate and Y coordinate in FIG. 9, respectively), an interpolation signal $A_{22}$ at the insensitive pixel 11 should be calculated as $$A_{22}=(A_{21}+A_{12}+A_{32}+A_{23})\div 6+(A_{11}+A_{31}+A_{13}+A_{33})\div 12$$

For example, if $A_{21}=80$, $A_{12}=84$, $A_{32}=77$, $A_{23}=88$, $A_{11}=68$, $A_{31}=76$, $A_{13}=90$ and $A_{33}=76$, then it follows that $A_{22}=81$. The interpolation expression conducts weighted averaging by providing signal values of sensitive pixels located in the longitudinal direction and the lateral direction with a weight which is twice as large as that for signal values of sensitive pixels located in the diagonal direction.

For conducting interpolation processing as represented by the interpolation expression, it is desirable to arrange the insensitive pixels 11 so as to make the arrangement period coarser than intervals of two rows and two columns.

According to the present embodiment, the reference signal can be obtained in the vicinity of a pixel at which infrared rays are actually detected and consequently the distribution of the substrate temperature can be monitored more faithfully.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. An infrared solid-state image sensor comprising:
    a semiconductor substrate;
    a pixel area comprising a sensitive pixel area where a plurality of infrared detection pixels are arranged in a matrix form to detect incident infrared rays on the semiconductor substrate and a reference pixel area where a plurality of reference pixels are provided, each of the infrared detection pixels comprising a thermoelectric conversion part, the thermoelectric conversion part comprising an infrared absorption film to absorb the incident infrared rays and convert the incident infrared rays to heat and a first thermoelectric conversion element to convert the heat obtained by the conversion in the infrared absorption film to a electric signal, each of the reference pixels comprising a second thermoelectric conversion element;
    a plurality of row selection lines provided in the pixel area so as to correspond to rows of the infrared detection pixels respectively, each of the row selection lines being connected to first ends of the first thermoelectric conversion elements in the infrared detection pixels on a corresponding row;
    a plurality of signal lines provided in the pixel area so as to correspond to columns of the infrared detection pixels respectively, each of the signal lines being connected to second ends of the first thermoelectric conversion elements in the infrared detection pixels on a corresponding column to read out an electric signal from an infrared detection pixel on the corresponding column as a signal potential;
    a reference potential line to which first ends of the second thermoelectric conversion elements respectively in the plurality of reference pixels are connected;
    a plurality of first constant current sources provided so as to correspond to columns of infrared detection pixels, each of the first constant current sources being connected to second ends of the first thermoelectric conversion elements in the infrared detection pixels on a corresponding column;
    a plurality of second constant current sources provided so as to correspond to the plurality of reference pixels, each of the second constant current sources being connected to the reference potential line; and
    a plurality of amplifiers provided so as to correspond to respective signal lines, each of the amplifiers amplifying a difference between the signal potential read out from a corresponding signal line and a reference potential supplied from the reference potential line.

2. The sensor according to claim 1, wherein the reference pixel area is arranged so as to be adjacent to at least two sides of the sensitive pixel area in which the plurality of infrared detection pixels are arranged in a matrix form.

3. The sensor according to claim 1, wherein the reference pixel area comprises sub-areas provided so as to respectively accommodate the reference pixels, and each of the sub-areas is provided in the sensitive pixel area so as to replace a reference pixel in the sub-area by one infrared detection pixel.

4. The sensor according to claim 1, wherein a plurality of concave parts arranged in a matrix form so as to correspond to the infrared detection pixels are formed in a surface part of the semiconductor substrate, each of the infrared detection pixels further comprises first and second supporting structure parts to support the thermoelectric conversion element over a corresponding concave part, the first supporting structure part comprises a first interconnection connected at a first end thereof to a first end of a thermoelectric conversion element in a corresponding infrared detection pixel and connected at a second end thereof to a row selection line to which the corresponding infrared detection pixel is connected, and the second supporting structure part comprises a second interconnection connected at a first end thereof to a second end of the thermoelectric conversion element in the corresponding infrared detection pixel and connected at a second end thereof to a signal line to which the corresponding infrared detection pixel is connected.

5. The sensor according to claim 1, wherein the reference pixels are thermal insensitive pixels which are insensitive to heat of the incident infrared rays.

6. The sensor according to claim 1, wherein each of the reference pixels is an optical insensitive pixel comprising an infrared reflection film which is formed so as to cover the second thermoelectric conversion element and which reflects the incident infrared rays.

7. The sensor according to claim 1, wherein each of the first and second thermoelectric conversion elements comprises diodes connected in series.

8. The sensor according to claim 1, wherein each of the first and second thermoelectric conversion elements comprises resistors connected in series.

* * * * *